United States Patent [19]

Sato

[11] Patent Number: 4,739,438
[45] Date of Patent: Apr. 19, 1988

[54] INTEGRATED CIRCUIT WITH AN IMPROVED INPUT PROTECTIVE DEVICE

[75] Inventor: Yoshinori Sato, Tokyo, Japan
[73] Assignee: NEC Corporation, Tokyo, Japan
[21] Appl. No.: 736,728
[22] Filed: May 22, 1985
[30] Foreign Application Priority Data May 22, 1984 [JP] Japan .............................. 59-102865

[51] Int. Cl.⁴ .............................................. H02H 3/20
[52] U.S. Cl. ........................................ 361/91; 361/56; 357/23.13
[58] Field of Search ........................... 361/56, 91, 111; 307/200 B, 304; 357/23.13, 41, 51

[56] References Cited

U.S. PATENT DOCUMENTS 3,777,216 12/1973 Armstrong ........................... 361/111
3,819,952 6/1974 Enomoto et al. ................. 361/111 X
3,967,295 6/1976 Stewart ............................... 357/42 X
4,423,431 12/1983 Sasaki .............................. 361/56 X Primary Examiner—A. D. Pellinen
Assistant Examiner—Derek S. Jennings
Attorney, Agent, or Firm—Sughrue, Mion, Zinn, Macpeak & Seas

[57] ABSTRACT

The invention relates to an improved protective transistor arrangement for MIS circuits and the like which is capable of stable operation without breakdown in the event of a surge voltage. The protective transistor has a channel region whose length varies along the width of the channel such that the channel length at the central portion of the channel region is made less than the channel length at the sides of the channel region. By way of this construction, the current path through the protective transistor is largely confined to the central area of the channel region, preventing current from being concentrated at side portions of the channel region adjacent the field oxide surrounding the transistor.

11 Claims, 3 Drawing Sheets

INTEGRATED CIRCUIT WITH AN IMPROVED INPUT PROTECTIVE DEVICE

FIELD OF THE INVENTION

The present invention relates to integrated circuits, and particularly to input protective devices for integrated circuits.

In a semiconductor integrated circuit employing insulated gate field effect transistors (IGFET's), an input protective device is used for preventing a surge voltage from being applied to gate of an input IGFET. Conventional input protective devices are generally composed of an input protective resistor connected between an input terminal and the gate of the input IGFET to be protected and an input protective IGFET having its drain-source path coupled between a portion of the input protective resistor and a reference potential. The arrangement is such that any high surge voltage applied to the input terminal 1 is attenuated by the input protective resistor and is absorbed by the short-circuiting action of the input protective IGFET. The drain diffusion region of the input protective IGFET is connected to the protective resistor, made of a polycrystalline silicon layer, while the source diffusion region and the gate electrode are connected to a reference voltage line made of aluminum. In this conventional input protective device, when a high surge voltage is applied to the input terminal and the protective IGFET allows the passage of electric currents therethrough, the currents concentrate at the defective portion of the thick field oxide surrounding the protective IGFET. As a result, the protective IGFET may be destroyed, thus failing to provide sufficient protection against a surge voltage. Furthermore, the gate of the protecting IGFET 2 is directly connected to the ground voltage. Therefore, it has been difficult to make the IGFET 2 conductive when the surge voltage is relatively small but large enough to destroy the IGFET 3.

SUMMARY OF THE INVENTION

It is an object of the invention to provide a semiconductor integrated circuit with an improved input protective device which can operate stably without being destroyed.

The semiconductor device according to the present invention is of the type having an input terminal, an input transistor, and a protective transistor coupled between a reference potential and a part of the electric path between the input terminal and the gate of the input transistor, and is characterized in that a channel length of the above protective transistor is varied along its channel width in such a manner that the channel length at a center portion of the channel region is shorter than that at both sides or peripheral portions of the channel region. According to the invention, an electric current flowing through the channel region is concentrated around the center portion of the channel region and the current density at the side portions or the peripheral portions of the channel region is reduced. Therefore, the current concentration near the field oxide layer, i.e. at the periphery of the channel region, can be effectively avoided.

According to one aspect of the present invention, the gate of the protective transistor is connected to the reference potential through a resistor (hereinafter referred to as gate resistor). According to this aspect, when a surge voltage is applied to the input terminal, the potential at the gate of the protective transistor can be raised easily to quickly make the protective transistor conductive. Therefore, the surge voltage can be effectively discharged to the reference potential by the protective transistor.

DETAILED DESCRIPTION OF THE INVENTION

Figure 1:
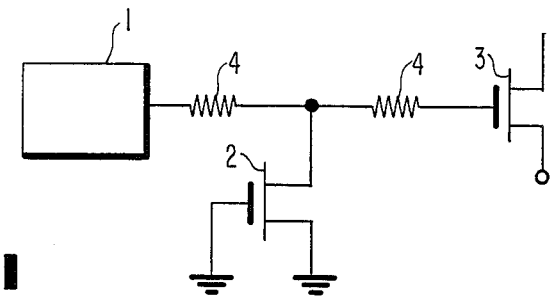
FIG. 1 is a circuit diagram of an example of a conventional input protective device.
Figure 2:
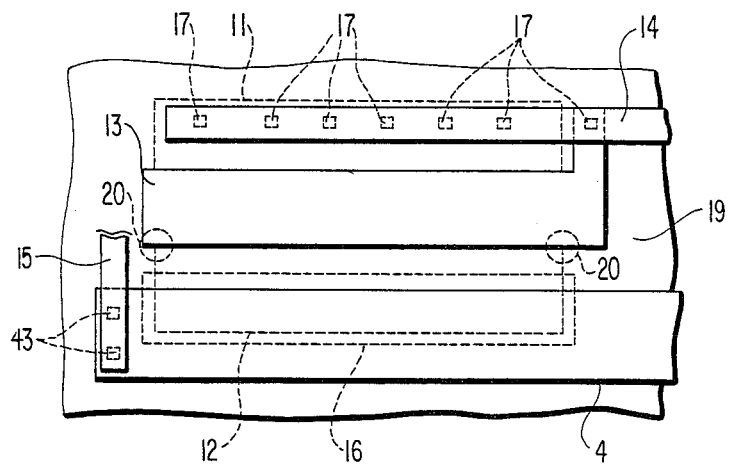
FIG. 2 is a plan view showing the construction of the example shown in FIG. 1.

First, referring to FIGS. 1 and 2, a protective device according to the prior art is described.

FIG. 1 is a circuit diagram of an example of a conventional input protective device, while FIG. 2 is a plan view showing the construction of the conventional input protective device shown in FIG. 1.

The input protective device has an input protective resistor 4 connected between the input terminal 1 and the input N-channel MIS transistor 3 (referred to as an input transistor, hereinunder), and an input protective N-channel MIS transistor 2 (referred to as a protective transistor, hereinunder) having a drain connected to a portion of the input protective resistor 4 and a source and a gate which are connected to a ground voltage terminal. The arrangement is such that any high surge voltage applied to the input terminal 1 is attenuated by the input protective resistor and is absorbed by the short-circuiting action of the protective input transistor 2.

As will be seen from FIG. 2, in this conventional input protective device, the drain diffusion region 12 of the input protective transistor 2 is connected through an opening 16 to the protective resistor 4 constituted by a polycrystalline silicon layer, while the source diffusion region 11 and the gate electrode 13 are connected through openings 17 to a ground voltage line 14 composed of aluminum. On the other hand, the protective resistor 4 is connected through openings 18 to a line 15 composed of aluminum and leading to the input gate.

In this protective transistor, when a high surge voltage is applied as an input, electric currents are concentrated at the defective portions 20 (indicated by broken-line circles in FIG. 2) of a thick field oxide film 19 formed by the LOCOS method, so as to surround a part of the pattern, in particular the protective transistor. As a result, the protective transistor 2 may break down, thus failing to provide sufficient protection against surge voltage as required.

A preferred embodiment of the invention will be described hereinunder with reference to FIGS. 3 to 5.

Figure 3:
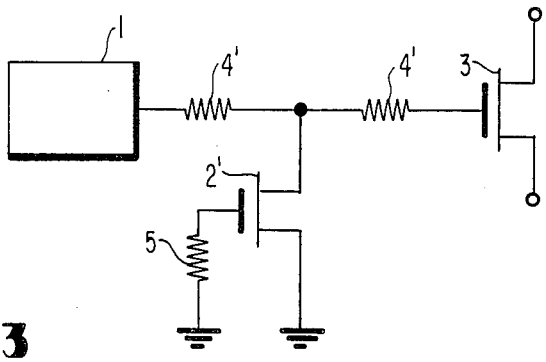
FIG. 3 is a circuit diagram of an embodiment of the invention.

FIG. 3 shows a basic circuit diagram of an embodiment of the invention.

This input protective device is basically composed of a protective resistor 4' connected between an input terminal 1 and the gate of an input transistor 3 to be protected, which is an N-channel MIS transistor, and a protective N-channel MIS transistor 2' having a drain connected to a portion of the protective resistor 4', a source connected to a ground terminal, and a gate connected to the ground terminal through a gate resistor 5.

According to this circuit arrangement, the gate of the protective transistor 2' is connected to the ground through the resistor 5, and therefore when a surge voltage is applied to the input terminal 1, the potential at the gate of the protective transistor 2' is easily raised in response to the surge voltage through the gate-drain capacitance to make the transistor 2' conductive. Accordingly, the surge voltage is effectively discharged to the ground potential through the protective transistor 2'.

Figure 4:
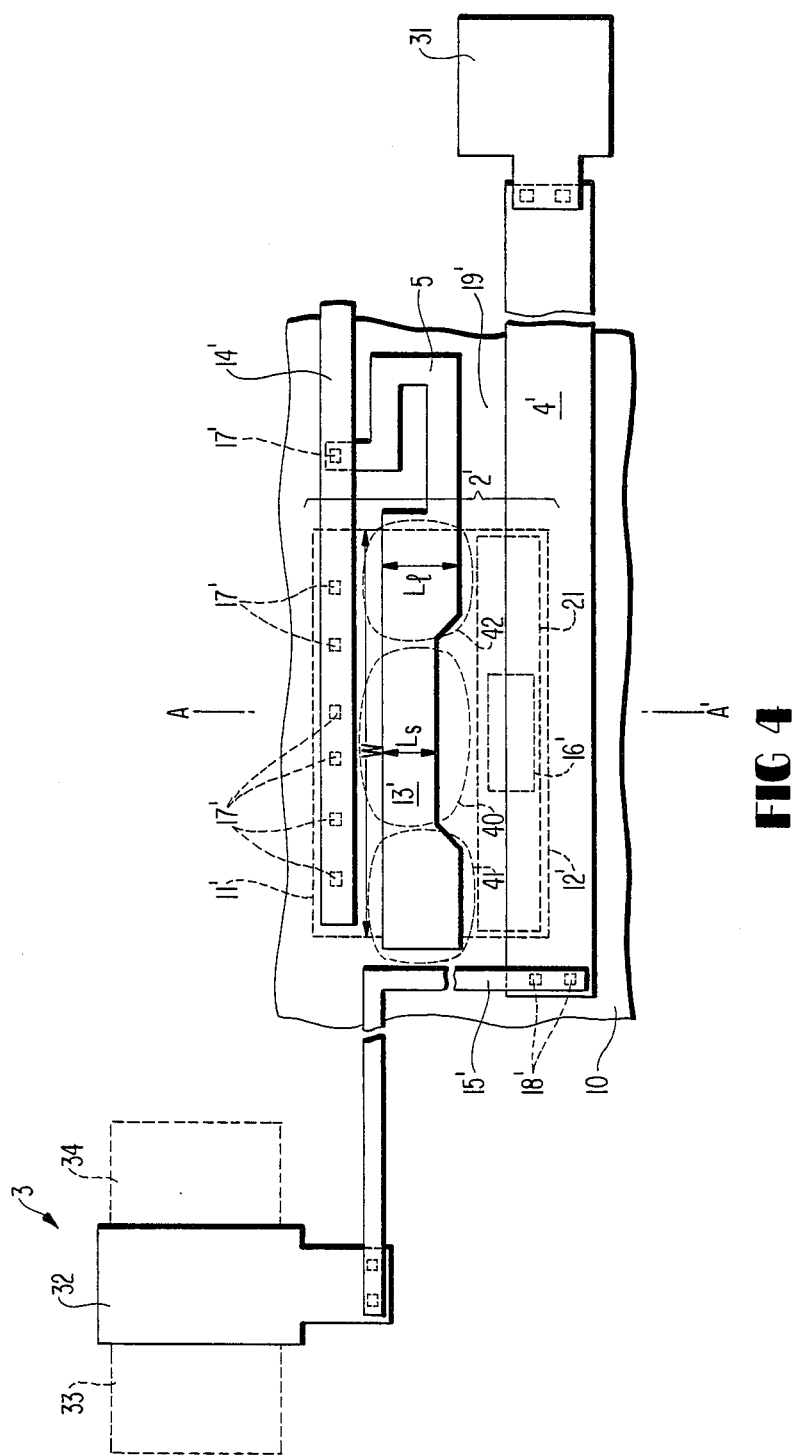
FIG. 4 is a plan view showing the construction of the embodiment.
Figure 5:
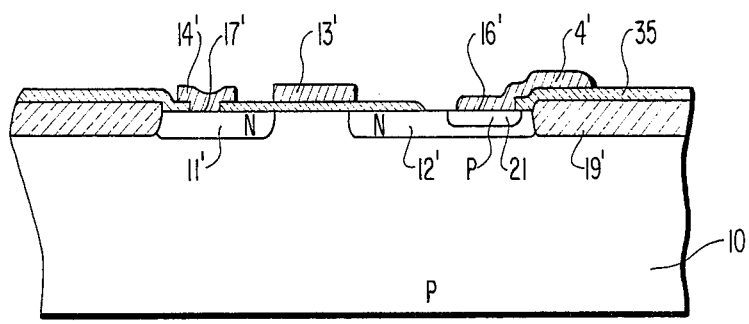
FIG. 5 is a sectional diagram along the axis A—A' of FIG. 4.

Referring to FIGS. 3 and 4, a detailed embodiment of the invention is explained.

The N-channel input transistor 3 and the N-channel protective transistor 2' are formed on a P-channel semiconductor substrate 10.

The protective transistor 2' includes an N-type drain region 12', an N-type source 11' and a gate wiring 13' formed of polycrystalline silicon. The input resistor 4' is coupled between the input pad 31 formed of aluminum and a gate wiring 15' connected to a gate electrode 32 of the input transistor 3 having drain region 33 and a source region 34. At the periphery of the respective transistors, a thick field oxide layer 19' is formed in a well known manner. A P-type diffusion region 21 is formed in the drain region 12'. A surface insulating layer 35 is formed over the surface of the substrate 10. The protective resistor 4' is contacted to the drain region 12' through the P-type region 21 at an opening 16' formed in the insulating layer 35, as shown in FIG. 4. Differently from the device of FIG. 2, the opening 16' to the drain is located only at the central portion of the regions 12', 21. The ground voltage line 14' is formed of aluminum and connected to the resistive gate wiring 5 at a contact hole 17' and to the source region 11' at a plurality of contact holes 17'. The channel length of the protective transistor 2' varies along the channel width W. Namely, the channel length Ls near the center portion 40 of the channel is made shorter than the channel length $L_L$ at both side portions 41 and 42 of the channel. Accordingly, the effective conductance per unit width at the center portion 40 is made larger than at the portions 41 and 42. Also, the distance between the portion 40 and the contact hole 16' is shorter than that between the portions 41 and 42 and the contact hole 16. Thus, the current density at the portions 41 and 42 can be effectively reduced.

According to one typical example, values of the channel length Ls, $L_L$ and the channel width W are 11 $\mu$m, 14 $\mu$m and 80 $\mu$m, respectively. Also, the values of the resistances of the resistors 4' and 5 are 1.2K$\Omega$ and 500$\Omega$, respectively.

According to the invention, a sufficiently high surge voltage protection effect is obtained for the following reasons:

(i) In the conventional device, the contact 16' to the polycrystalline silicon, through which the drain region 12 of the protective transistor 2 and the protective resistor 4 are connected to each other, is extended over the entire length of the drain region. In contrast, according to the invention, the opening 16' is reduced in size and formed at a location apart from the field oxide film 19', thereby preventing the concentration of electric currents at the defective part of the field oxide film.

(ii) The gate electrode 13' of the protective transistor 2' is connected to the ground voltage line 14' through a gate resistor 5 consisting of polysilicon, thus facilitating the floating of the gate potential in the event of a surge voltage, whereby the protective transistor 2' is easily turned on thus allowing the surge voltage to be relieved to the ground terminal.

(iii) The length (L) of the gate electrode 13' (i.e. the channel region) of the protective transistor 2' is made shorter at the central portion adjacent the contact portion 16' so that the on-resistance of the protective transistor 2' is reduced to allow the concentration of the currents at the central portion of the protective transistor 2'.

In the above embodiment, the P-type region 21 is formed in the drain region 12' and the resistor 4' is connected to the drain region 12' through the P-type region 21.

Figure 6:
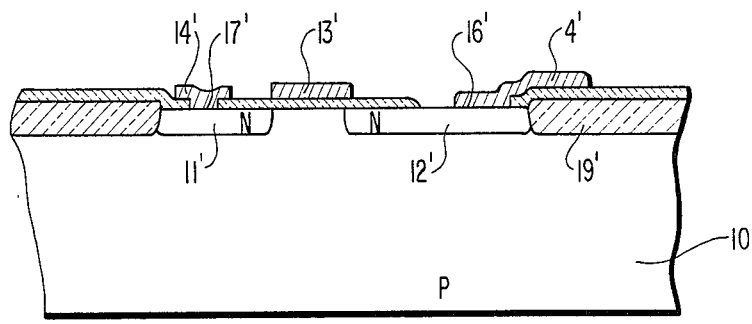
FIG. 6 is a sectional diagram showing another embodiment of the invention.

However, it is also possible to directly connect the resistor 4' to the drain region 12' without forming the P-type region 21, as shown in FIG. 6.

The MIS integrated circuit device incorporating the described embodiment has actually been shown to afford protection effective against high surge voltages exceeding 250 V.

Although the foregoing description has been made using an N-channel MIS transistor, this arrangement is not exclusive and the invention can be realized by a P-channel MIS transistor. In such a case, the drain and the source designations in the foregoing description would be reversed.

In addition, the number of openings 16' may be increased as desired within the scope of the invention, although the described embodiment employs only one opening 16'.

As has been described, according to the invention, it is possible to avoid the concentration of a surge current at the defective part of the thick field oxide film formed by the LOCOS method. Thus, an input protective device for MIS integrated circuit device, capable of affording high protection against surge voltages as required by applicable standards, can be obtained.

I claim:

1. A semiconductor device, comprising; an external terminal, a functional transistor, first means for connecting said external terminal to said functional transistor, a protective transistor, second means for connecting one of a drain and source of said protective transistor to a part of an electrical path provided by said first means between said external terminal and said functional transistor, said protective transistor having an insulator layer including a contact hole for exposing only a center portion of a surface of said one of said drain and source thereof, said second means connecting said center portion to said electrical path formed by said first means, third means for connecting the other of said drain and source of said protective transistor to a predetermined voltage, and fourth means for biasing a gate of said protective transistor in such a manner that said protective transistor assumes a conductive state only when an excessive voltage outside of a normal operation voltage range is applied to said external terminal, said protective transistor being formed on a semiconductor substrate and surrounded by a field oxide formed on said substrate, both side portions of a channel region between source and drain regions of said protective transistor being adjacent said field oxide, the channel length at said side portions of said channel region of said protective transistor being longer than the channel length at a center portion of said channel region of said protective transistor, to thereby prevent a concentration of electric current at said side portions of said channel region when a current flows through said channel region upon the application of an excessive voltage to said external terminal.

2. The semiconductor device according to claim 1, in which said fourth means includes a first resistive element coupled between the gate of said protecting transistor and said predetermined voltage.

3. The semiconductor device according to claim 1, in which said first means includes a second resistive element coupled between said functional transistor and said external terminal.

4. A semiconductor device, comprising; an input terminal, an input transistor, first means for electrically connecting a gate of said input transistor to said input terminal, a protective transistor formed on a semiconductor substrate, a length at a central portion of a channel region between source and drain regions of said protective transistor being shorter than a length at side portions of said channel region, one of said drain and source regions being covered by an insulating layer including a contact hole exposing only a central part of said one region, second means for electrically connecting said one of said drain and source of said protective transistor to the gate of said input transistor through said contact hole, third means for electrically connecting the other of said drain and source of said protective transistor to a reference voltage terminal, and a resistor coupled between the gate of said protective transistor and said reference voltage terminal whereby electric currents flowing through said protective transistor are concentrated at said central portion of said channel region when an excessive voltage is applied to said input terminal.

5. The device according to claim 4, in which said first means includes a resistive element coupled between said gate of said input transistor and said input terminal.

6. The device according to claim 4, in which said second means connects said one of drain and source of said protecting transistor to a part of electrical path of said first means.

7. A semiconductor device, comprising; an external terminal, a semiconductor substrate of a first conductivity type; a functional transistor formed on said substrate; a protective transistor formed on said substrate, said protective transistor having a channel region defined at a surface of said substrate, a gate formed on said channel region via an insulating layer, and first and second impurity regions of a second conductivity type spaced apart via said channel region, said first and second impurity regions serving as source and drain regions of said protective transistor, a channel length at side portions of said channel region being longer than a channel length at a center portion of said channel region; a field oxide selectively formed on the surface of said substrate and surrounding said functional and protective transistors; first means for connecting said external terminal to said functional transistor; second means for connecting said first impurity region to a part of an electrical path provided by said first means between said external terminal and said functional transistor, said second means including a layer covering said first impurity region and having a contact hole exposing a limited area of a central portion of said first impurity region for connection to said part of said electrical path; third means for connecting said second impurity region to a predetermined voltage source, and fourth means for connecting said gate of said protective transistor to said predetermined voltage source.

8. The semiconductor device according to claim 7, in which said fourth means includes a first resistive element coupled between the gate of said protective transistor and said predetermined voltage source.

9. The semiconductor device according to claim 7, in which said first means includes a second resistive element coupled between said functional transistor and said external terminal.

10. A semiconductor device, comprising; an external terminal, a semiconductor substrate of a first conductivity type; a functional transistor formed on said substrate; a protective transistor formed on said substrate, said protective transistor having a channel region defined at a surface of said substrate, a gate formed on said channel region via an insulating layer, and first and second impurity regions of a second conductivity type spaced apart via said channel region, said first and second impurity regions serving as source and drain regions of said protective transistor, a channel length at side portions of said channel region being longer than a channel length at a center portion of said channel region; a third impurity region of said first conductivity type formed in said first impurity region; first means for connecting said external terminal to said functional transistor; second means for connecting said third impurity region to a part of an electrical path provided by said first means between said external terminal and said functional transistor; third means for connecting said second impurity region to a predetermined voltage source; and fourth means for connecting said gate of said protective transistor to said predetermined voltage source.

11. The semiconductor device according to claim 10, in which said second means includes a resistive wiring having a part connected to said third impurity region.

* * * * *

UNITED STATES PATENT AND TRADEMARK OFFICE
CERTIFICATE OF CORRECTION

PATENT NO.   :   4,739,438
DATED        :   April 19, 1988
INVENTOR(S)  :   SATO It is certified that error appears in the above-identified patent and that said Letters Patent is hereby corrected as shown below:

Column 2, line 51, delete "18" insert --43--

Signed and Sealed this

Seventeenth Day of January, 1989

Attest:

DONALD J. QUIGG

Attesting Officer

Commissioner of Patents and Trademarks